US00RE35278E

United States Patent [19]

Newman et al.

[11] E Patent Number: Re. 35,278

[45] **Reissued Date of Patent: * Jun. 18, 1996**

[54] PROCESS FOR PRODUCING ELECTRICALLY CONDUCTIVE COMPOSITES AND COMPOSITES PRODUCED THEREIN

[75] Inventors: Paul R. Newman, Newbury Park; Leslie F. Warren, Jr., Camarillo; Edward F. Witucki, Van Nuys, all of Calif.

[73] Assignee: Rockwell International Corporation, Seal Beach, Calif.

[ * ] Notice: The portion of the term of this patent subsequent to Apr. 15, 2003, has been disclaimed.

[21] Appl. No.: 871,872

[22] Filed: Apr. 21, 1992

Related U.S. Patent Documents

Reissue of:

[64] Patent No.: 4,617,228
Issued: Oct. 14, 1986
Appl. No.: 646,717
Filed: Sep. 4, 1984

[51] Int. Cl.[6] ..... B05D 3/02; B05D 5/12; B32B 7/00; B32B 5/14

[52] U.S. Cl. ..... 428/265; 427/121; 427/342; 427/389.8; 427/389.9; 428/268; 428/308.4

[58] Field of Search ..... 252/569; 427/121, 427/342, 389.8, 389.9; 428/264, 268, 265, 308.4

[56] References Cited

U.S. PATENT DOCUMENTS

| | | | |
|---|---|---|---|
| 2,354,110 | 7/1944 | Ford et al. | 428/268 X |
| 3,715,233 | 2/1973 | Harrier | 427/389.8 |
| 4,214,031 | 7/1980 | Miyakawa et al. | 428/213 |
| 4,330,573 | 5/1982 | Kostandov et al. | 427/389.8 X |
| 4,401,545 | 8/1983 | Naarmann et al. | 204/291 |
| 4,468,291 | 8/1984 | Naarmann et al. | 204/12 X |
| 4,617,228 | 10/1986 | Newman et al. | 428/265 |

FOREIGN PATENT DOCUMENTS 3321281 12/1983 Germany .

OTHER PUBLICATIONS

Niwa, O. et al, "Electrochemical Polymerization of Pyrrole on Polymer–Coated Electrodes", J. Chem. Soc., Chem. Commun. Jul. 1, 1984, pp. 817, 818.

K. C. Khulbe et al., "Polymerization of Pyrrole by Potassium Persulfate" Journal of Polymer Science: Polymer Chemistry Edition, vol. 20, 1089–1095 (1982).

Pietro Pratesi, pp. 7055–7058 of vol. 31, Chemical Abstracts.

*Primary Examiner*—Michael Lusignan
*Attorney, Agent, or Firm*—Charles T. Silberberg; Lawrence N. Ginsberg

[57] ABSTRACT

Production of electrically conductive composites comprising a dielectric porous substance, e.g., fiberglass fabric, and a pyrrole polymer in the pores of such substance, by treating the porous substance with a liquid pyrrole, and then treating the resulting porous substance with a solution of a strong oxidant in the presence of a non-nucleophilic anion, such as ferric chloride. The pyrrole monomer is oxidized to a pyrrole polymer, which precipitates in the interstices of the porous material. Alternatively, the dielectric porous material can first be treated with a solution of strong oxidant and non-nucleophilic anion followed by treatment with liquid pyrrole, to precipitate an electrically conductive polypyrrole in the pores of the material. The resulting composite of porous material, e.g., fiberglass fabric, containing polypyrrole is electrically conductive while the other properties of such impregnated conductive porous material are substantially unaffected. Several treatments of the porous substance with the pyrrole and oxidant solutions can be carried out to increase the electrical conductivity of the composite.

34 Claims, No Drawings

PROCESS FOR PRODUCING ELECTRICALLY CONDUCTIVE COMPOSITES AND COMPOSITES PRODUCED THEREIN

Matter enclosed in heavy brackets [ ] appears in the original patent but forms no part of this reissue specification; matter printed in italics indicates the additions made by reissue.

BACKGROUND OF THE INVENTION

The present invention relates to the production of electrically conductive composites, and is particularly concerned with a process for conferring varying degrees of conductivity on electrically nonconductive porous structural materials, and the resulting electrically conductive composites.

In the past several years organic polymers have been discovered which have metallic properties, particularly electrical conductivity up to about 1000 $ohm^{-1}cm^{-1}$. These polymers include doped polyacetylene and polypyrrole.

Although there are many potential applications for conducting polymers, their use has been limited by the fact that they are chemically unstable, have poor mechanical properties and/or are difficult to produce in suitable forms.

Polypyrrole which is chemically more stable, for example, than the doped polyacetylene, has the disadvantage of being very brittle. Thin free-standing polypyrrole films from about 10 μm to 20 mil thick have been produced on electrodes by electrochemical polymerization. However, these prior art films are too thin and too brittle to be useful in most structurally related applications. Particularly, the brittleness of such conducting polymer films renders their handling for large area applications extremely difficult, if not impossible.

Polypyrrole is produced by electropolymerization as described by A. F. Diaz, et al., in an article entitled "Electrochemical Polymerization of Pyrrole" in the Journal of Chemical Society, Chemical Communications, 1979, page 635. N-substituted analogs of pyrrole such as N-methylpyrrole and N-phenylpyrrole have been used to form polymers as reported by A. F. Diaz, et al., in an article entitled. "Electrochemistry of Conducting Polypyrrole Films" in the Journal of Electroanalytical Chemistry, 129, (1981) pages 115–132. The products produced in these processes are thin (from 20 μm to 30 μm) freestanding films in which anions from the electrolyte, such as tetrafluoborate and perchlorate, are used to dope the polymer and balance the cationic charge of the polymer backbone. However, the resultant polymer film is brittle and does not have the bulk and ductility needed to make the material useful in structural-related applications.

U.S. Pat. No. 4,401,545 to Naarmann, et al., discloses electrically conductive polypyrrole complexes with nitroaromatic anions as dopants, prepared by the anodic oxidation of a pyrrole in a polar solvent, in the presence of a salt of an acidic nitroaromatic compound. However, the thickness of the resulting electrochemically produced polypyrrole complexes is limited and the resulting films are also relatively brittle and hence also have limited structural applicability.

U.S. Pat. No. 4,394,304 to Wnek, discloses a method of forming a conductive polymer by impregnating a processable polymer such as polyethylene or polystyrene, with a Ziegler Natta catalyst, exposing the impregnated polymer to acetylene gas to form polyacetylene within a matrix of the initial polymer, and introducing a dopant, such as iodine, into the polyacetylene, to form a conductive polymer blend. However, a major disadvantage of the resulting conductive polymer blend is the fact that it is unstable when exposed to air or to water.

U.S. application Ser. No. 646,716, filed Sept. 4, 1984, now U.S. Pat. No. 4,582,575, patented Apr. 15, 1986, titled "Electrically Conductive Composites and Method of Preparation," of L. F. Warren, Jr., L. Maus and D. S. Klivans, and assigned to the same assignee as the present application, discloses electrically conductive composites comprising a dielectric porous substance, e.g., fiberglass fabric, and a pyrrole polymer deposited in the pores of such substance. The composites are produced by contacting the porous substance with an anode in an electrolytic cell containing an electrolyte comprising a pyrrole monomer and a substantially non-nucleophilic anion such as bisulfate, and passing an electric current through the cell, thus electrochemically precipitating a conductive pyrrole polymer in the pores of such substance.

An object of the present invention is to readily confer varying degrees of conductivity on porous structural materials.

Another object of the invention is to provide a procedure for obtaining an electrically conductive composite formed of a substantially non-conductive or dielectric porous substance and a conductive polypyrrole, which is stable and has good mechanical properties.

A still further object of the invention is the provision of a process for depositing a polypyrrole within a dielectric porous structural material to produce an electrically conductive composite.

SUMMARY OF THE INVENTION

The above objects are achieved according to the invention and a structural material rendered electrically conductive, by contacting a structural material which is porous, e.g., a fiberglass fabric, with a liquid pyrrole or a solution of the pyrrole, and then contacting the material with a solution of a strong oxidant, such as ferric ion, in the presence of a substantially non-nucleophilic anion, such as chloride ion, e.g., as provided by ferric chloride. The pyrrole is thus oxidized and polypyrrole is chemically precipitated in the pores or interstices of the material, and the resulting impregnated composite rendered electrically conductive.

Alternatively, the porous structural material can be contacted or treated first with a solution of a strong oxidant, and the so-treated material can then be contacted with a liquid pyrrole or a solution of pyrrole, in the presence of a non-nucleophilic anion, to oxidize the pyrrole and precipitate polypyrrole within the interstices of the material, to form an electrically conductive composite.

Several (two or more) treatments of the substrate, e.g., fiberglass fabric, with the pyrrole and oxidant solutions can be carried out to increase the conductivity of the final composite.

The degree of conductivity conferred upon the porous structural material by the precipitation of the conductive pyrrole polymer into the pores of the material can vary, the magnitude of conductivity depending upon the volume of the pores occupied by the pyrrole polymer, and other factors such as the ratio of pyrrole to substituted pyrrole, where a mixture of pyrrole monomers is employed in the pyrrole treating solution, the concentration of the pyrrole and oxidant solutions and the number of treatments of the substrate with such solutions. Thus, a porous dielectric or electrically insulating structural material such as fiberglass can be rendered conductive to varying degrees according to the present invention.

These and other objects and features of the invention will become apparent from the following detailed description thereof.

DETAILED DESCRIPTION OF THE INVENTION AND PREFERRED EMBODIMENTS

According to one embodiment of the invention, a structural material, which is a dielectric or electrically insulating material, and which is porous to the extent that it possesses voids or interstices which can hold small amounts of liquid, is dipped into the liquid pyrrole or pyrrole solution, or a mixture of pyrrole and a substituted derivative thereof, such as an N-substituted pyrrole, the material removed, and excess liquid is drained away. The wet material or substrate is then dipped into a solution containing a strong oxidant and including a non-nucleophilic anion, such as $Fe^{3+}$ and $Cl^-$, respectively, derived from ferric chloride, resulting in the oxidation of the pyrrole and the chemical deposition of a polypyrrole, or a copolymer of pyrrole and a substituted derivative thereof, which to a major extent remains within the interstices of the material.

In another embodiment, the porous dielectric material is treated with the liquid pyrrole or pyrrole solution by applying such liquid pyrrole or solution to the material, followed by treatment of the wetted material with an oxidant solution, by applying the oxidant solution to the material.

The electrically conductive polymer thus deposited in the pores of the structural material or substrate comprises a cationic polypyrrole portion and an antionic portion derived from the non-nucleophilic anion, e.g., chloride. After air-drying, the dielectric material impregnated with the conductive pyrrole polymer is electrically conductive.

In carrying out the invention process, porous dielectrics or electrically insulating structural materials can be used, such as a porous ceramic, a porous glass, e.g., a frit, a porous or reticulated organic foam, e.g., polyurethane, a fabric, which can be woven or non-woven, e.g., fiberglass fabric, a mixed oxide fabric such as an alumina/silica/boria fabric, e.g., Nextel, or a synthetic organic fabric such as Kevlar, a trademark of the DuPont Company, for aromatic polyamide fiber, a polyester such as Dacron cloth, and the like. The insulating material can vary in thickness but should have pores which are sufficiently large to retain liquid. An insulating substrate such as fiberglass fabric, can have a thickness ranging from about 1 to about 20 mils, usually about 2 to about 10 mils.

The liquid pyrrole treating solution can comprise neat liquid pyrrole, a C-substituted pyrrole, such as a 3- or 3,4-alkyl or aryl substituted pyrrole, e.g., 3-methylpyrrole, 3,4-dimethylpyrrole, 3-phenylpyrrole or 3-methyl- 4-phenylpyrrole, an N-substituted pyrrole, e.g., an N-alkylpyrrole, such as N-methylpyrrole, or an N-arylpyrrole such as N-phenylpyrrole, or a substituted N-phenylpyrrole such as nitrophenylpyrrole, to obtain the corresponding conductive pyrrole homopolymer. For production of a conductive copolymer, a mixture of pyrrole and a C- or an N-substituted derivative of pyrrole, as described above, can be employed. The use of substituted pyrroles results in lower conductivity polymers than the parent polypyrrole. Hence the use of pyrrole is preferred for higher conductivity applications.

The pyrrole solution may or may not contain a solvent. The solvents used can be any organic solvent in which pyrrole and the oxidant are soluble, and which does not interfere with the desired oxidation reaction. Such solvents include alcohols, ethers, e.g., dioxane, acetone, acetonitrile, tetrahydrofuran, methylene chloride, and the like. Water, alone or in combination with a water miscible solvent also can be employed. The concentration of the pyrrole in the solvent can vary but generally is in the range from about 0.03 to about 2 molar.

The oxidation of pyrrole or a substituted derivative thereof to produce the conductive pyrrole polymer is carried out in the presence of a strong oxidant. The term "strong oxidant" as employed herein is intended to denote any oxidizing substance which is capable of oxidizing pyrrole or a substituted derivative thereof as defined above, to produce polypyrrole or a pyrrole copolymer.

Examples of strong oxidants include the cations $Fe^{3+}$, $Cu^{2+}$, $Ce^{4+}$, $NO^+$ and $(C_6H_5)_3C^+$. Examples of compounds providing the above cations as oxidizing agents are the soluble salts of the above cations such as ferric perchlorate, ferric chloride, cupric fluoborate, cupric perchlorate, nitrosyl hexafluorophosphate triphenylmethyl fluoborate, ceric sulfate and the like.

Other suitable oxidizing agents such as an anion, e,g., the persulfate anion, can be employed.

Further, instead of employing oxidents in the form of cations or anions, neutral oxidants such as hydrogen peroxide in an acid solution, e.g., in dilute sulfuric acid, can be employed.

A material providing substantially non-nucleophilic anions functioning as dopant for the pyrrole polymer is also employed, preferably in conjunction with the oxidant. These anions are generally strong acid anions such as sulfate, bisulfate, perchlorate, fluoborate, $PF_6^-$, $AsF_6^-$ and $SbF_6^-$ anions. Chloride anion also can be used, even though it is somewhat nucleophilic.

Examples of compounds providing such anions are the free acids and the soluble salts of such acids, e.g., the alkali metal salts. Examples of such compounds include sulfuric acid, sodium sulfate, sodium bisulfate, sodium perchlorate, ammonium fluoborate, hydrogen hexafluoroarsenate, and the like. In addition, the nonnucleophilic anion can be a sulfonate salt or sulfonic acid anion derived from an organic sulfonate or an organic sulfonic acid, e.g., as provided by p-toluenesulfonate and polymeric sulfonates, e.g., polystyrenesulfonate and polyvinylsulfonate, and trifuoromethylsulfonate, $CF_3SO_3^-$. Also organic sulfate anion such as dodecylsulfate can be employed.

Although the oxidant as cation and the non-nucleophilic anion can be provided by separate compounds, a convenient manner for providing both the strong oxidant and non-nucleophilic anion is in the form of a salt incorporating both the oxidant cation and the non-nucleophilic anion, as exemplified by the above-noted compounds ferric perchlorate, ferric chloride, cupric fluoborate, cupric perchlorate, and the nitrosyl and triphenylmethyl salts. When ferric chloride is used, the non-nucleophilic anions present include $FeCl_4^-$ and $FeCl_4^{2-}$, as well as chloride ion.

Where, for example, ammonium persulfate is used as the oxidant of the pyrrole dissolved in dilute sulfuric acid, the persulfate anion is the oxidizing agent and the non-nucleophilic anion is the $HSO_4^-$ or bisulfate anion derived from the sulfuric acid. If hydrogen peroxide is employed as oxidant in a sulfuric acid medium, the non-nucleophilic anion again is the bisulfate anion.

The oxidant which preferably also incorporates the non-nucleophilic anion, e.g., as in ferric chloride, can be dissolved in water to form an aqueous solution, or such oxidant can be dissolved in an organic solvent, dependent on its ability to dissolve the particular oxidant salt and its inertness with respect to such oxidant salt such that the oxidant retains its ability to oxidize the pyrrole in the presence of the solvent. Where separate compounds providing the oxidant and non-nucleophilic anion are provided, such solvent should be capable of suitably dissolving both compounds.

Examples of suitable solvents include alcohols, acetone, acetonitrile, tetrahydrofuran and methylene chloride. Thus, for example, the above-noted ferric salts can be dissolved in acetone, acetonitrile, tetrahydrofuran or methylene chloride. The triphenylmethyl salts are best employed in methylene chloride. The ferric or ceric salts can also be employed in aqueous solution.

The same or different solvents can be employed in the pyrrole and the oxidant solutions.

Although in preferred practice the non-nucleophilic anion or anion producing material is present in the oxidant solution, if desired, such anion or anion producing material can be provided in a solution separate from the oxidant solution. Further, if desired, the non-nucleophilic anion can be incorporated in the pyrrole solution.

The concentration of oxidant material or cation in aqueous or solvent solution can range from about 0.001 to about 2 molar, preferably about 0.1 molar, and the concentration of non-nucleophilic anion or anion producing material also can range from about 0.001 to about 2 molar, preferably about 0.1 molar.

The treatment of the porous dielectric material in the liquid pyrrole and in the oxidant solution is generally carried out in both instances at ambient or room temperature. However, the temperature can be higher or lower. Also, in preferred practice such treatments are carried out in the presence of oxygen in the air.

The time of treatment of the porous substrate in the pyrrole and oxidant solutions is long enough to penetrate the interstices of the porous material with the liquid pyrrole or pyrrole solution and to obtain sufficient penetration of the oxidant solution therein, or vice versa, to permit the precipitation reaction to occur in the interstices or pores. The oxidation reaction is frequently relatively slow, and can require several minutes, e.g., about 1 to 5 minutes for completion, during which time the substrate darkens as the polymerization reaction proceeds.

The polypyrrole which is thus chemically precipitated remains within the interstices of the dielectric porous material after drying thereof. Such drying of the polypyrrole impregnated porous material following removal thereof from the oxidant solution and rinsing with the same solvent as employed therein, can be carried out in the air at ambient or elevated temperature up to about 100° C.

Treating the porous substrate such as fiberglass fabric with the pyrrole. e.g., neat liquid pyrrole or a solution of pyrrole, by wetting or applying such liquid or solution to the porous substrate by means of a liquid dispenser, as by spraying or brushing, followed by similarly applying an oxidant solution to the wetted fabric, results in a better, more adherent deposit of the pyrrole polymer than the dipping or immersion procedure, since the latter procedure often results in polymer precipitation off the substrate into the solution.

If desired, the porous substrate can be treated first with the oxidant solution, followed by treatment of the substrate containing the oxidant solution in the interstices thereof, with the liquid pyrrole or pyrrole solution.

The dried porous material impregnated with pyrrole polymer has an electrical conductivity which can be measured with a standard 2-probe ohmmeter apparatus, and such conductivity generally corresponds to a sheet resistivity ranging from about 100,000 to about 50 ohms/square. The term "ohms/square" as a measure of sheet resistivity is defined as the bulk resistivity of the sample which is expressed in ohms×cm divided by the thickness in cm. Sheet resistivity is proportional to the reciprocal of electrical conductivity. The other properties of the impregnated conductive porous material or substrate are substantially unaffected by the impregnated conductive polymer. Thus, the resulting composite substantially retains the same mechanical properties that it possessed prior to impregnation.

To increase the conductivity of the porous material impregnated with pyrrole polymer, additional or repeated treatments of, for example, a fabric with a pyrrole and oxidant solution often are required to build up the polymer level in the material. Hence, the conductivity of the polymer impregnated substrate can be adjusted by the number of such treatments, as well as by varying the concentrations of the pyrrole and oxidant solutions.

The following are examples of the invention, it being understood that such examples are only illustrative and in no sense limitative of the invention.

EXAMPLE I

A piece of 7781 fiberglass fabric marketed by Uniglass Industries, Los Angeles, Calif., was first treated with enough neat liquid pyrrole by means of an applicator to penetrate the fabric.

The wetted fiberglass fabric was then treated with a 0.1 molar solution of anhydrous ferric chloride in acetone, by means of an applicator. Conductive polypyrrole formed of polypyrrole doped with chloride and also with chloroiron anions such as $FeCl_4^-$ and $FeCl_4^{2-}$, was precipitated in the interstices of the fabric. The resulting composite was then allowed to develop at ambient temperature for 5 minutes, washed with acetone and allowed to dry.

The resulting electrically conductive composite had a sheet resistivity of 15,000 ohms/square, as measured by a two-probe ohmmeter, relative to essentially infinite sheet resistivity for the initially untreated 7781 fiberglass fabric.

EXAMPLE II

The procedure of Example I was substantially followed except that the fiberglass fabric was first treated with the ferric chloride in acetone solution, and the fiberglass fabric containing ferric chloride in the interstices thereof, was then treated with neat pyrrole, to precipitate polypyrrole in the interstices of the fabric.

The polypyrrole impregnated fiberglass fabric or substrate had a sheet resistivity approximately the same as the sheet resistivity of the polypyrrole impregnated fiberglass fabric obtained in Example I.

EXAMPLE III

The procedure of Example I was substantially followed, except that the fiberglass fabric was first dipped into liquid pyrrole, the fiberglass fabric containing pyrrole in the interstices thereof was removed from the liquid pyrrole, excess liquid was drained from the material, and the resulting wetted material was then dipped into the ferric chloride in acetone solution.

The resulting electrically conductive composite had a sheet resistivity somewhat less than that of the composite of Example I.

EXAMPLE IV

The procedure of Example I was essentially followed except that in place of liquid pyrrole, a mixture of 70 mole % pyrrole and 30 mole % N-methylpyrrole was employed.

In this example, a conductive copolymer of pyrrole and N-methylpyrrole was formed in the interstices of the fiberglass fabric, comprised of the pyrrole copolymer cation and chloride and chloriron anions. The resulting fiberglass fabric impregnated with the pyrrole copolymer had a sheet resistivity of about 30,000 ohms/square.

EXAMPLE V

The procedure of Example I was essentially followed except employing as the oxidant a solution of 0.5 molar cupric perchlorate in acetonitrile.

The resulting dried composite of the fiberglass substrate impregnated with polypyrrole doped with perchlorate had a sheet resistivity of about 1500 ohms/square.

EXAMPLE VI

The procedure of Example I was substantially followed except that ferric perchlorate (0.1 molar) in acetonitrile was employed instead of the ferric chloride-acetone solution.

An electrically conductive composite of the fiberglass impregnated with polypyrrole doped with perchlorate was obtained. Such composite had a sheet resistivity of 30,000 ohms/square. A second treatment of the same composite in liquid pyrrole followed by treatment in the ferric perchlorate solution resulted in a lower sheet resistivity of 2,000 ohms/square.

EXAMPLE VII

The procedure of Example I was substantially followed but employing a solution of 0.2 molar ammonium persulfate in dilute (2%) sulfuric acid, instead of the ferric chloride-acetone solution.

An electrically conductive composite of the fiberglass fabric impregnated with polypyrrole doped with bisulfate was obtained, the composite having a sheet resistivity of 1500 ohms/square.

The electrically conductive composites of the invention have various uses including the production of electrodes, batteries, switches, semi-conductor components, and in anti-static applications, e.g., anti-static finishes for plastics, electromagnetic interference shielding applications and as electrical conductors.

From the foregoing, it is seen that the invention provides a novel procedure for chemical deposition of a conducting pyrrole polymer within a porous dielectric material or substrate so as to confer varying degrees of electrical conductivity upon the porous structural material.

Since various changes and modifications of the invention will occur to and can be made readily by those skilled in the art without departing from the invention concept, the invention is not to be taken as limited except by the scope of the appended claims.

What is claimed is:

1. A process for producing an electrically conductive composite which comprises the steps of:

(a) contacting a dielectric porous substance with a liquid pyrrole, (b) contacting said porous substance with a solution of a strong oxidant capable of oxidizing pyrrole to a pyrrole polymer, *said strong oxidant being a cation selected from the group consisting of* $Ce^{4+}$, $NO^+$ *and* $(C_6H_5)_3C^+$ *cations,* and (c) oxidizing said pyrrole by said strong oxidant in the presence of a substantially non-nucleophilic anion, and precipitating a conductive pyrrole polymer in the pores of said substance, *said non-nucleophilic anion being selected from the group consisting of sulfate, bisulfate, fluoroborate,* $PF_6^-$, $AsF_6^-$, *and* $SbF_6^-$ *anions.*

2. The process of claim 1, wherein step (a) is carried out prior to step (b).

3. The process of claim 1, wherein step (b) is carried out prior to step (a).

4. The process of claim 1, said contacting steps (a) and (b) being carried out by applying said liquid pyrrole and said oxidant solution to said porous substance or by immersion of said porous substance in said liquid pyrrole and said oxidant solution.

5. The process of claim 1, including carrying out a plurality of treatments of said porous substance with said liquid pyrrole and said oxidant solution.

6. The process of claim 1, said pyrrole monomer selected from the group consisting of pyrrole, a 3- and 3,4-alkyl and aryl C-substituted pyrrole, an N-alkylpyrrole and an N-arylpyrrole.

[7. The process of claim 1, said strong oxidant being a cation selected from the group consisting of $Fe^{3+}$, $Cu^{2+}$, $Ce^{4+}$, $NO^+$ and $(C_6H_5)_3C^+$ cations.]

8. The process of claim 1, said strong oxidant being an anion.

9. The process of claim 8, said oxidant anion being the persulfate anion.

[10. The process of claim 1, said non-nucleophilic anion being selected from the group consisting of sulfate, bisulfate, perchlorate, chloride, fluoborate, $PF_6^-$, $AsF_6^-$, and $SbF_6^-$ anions.]

11. [The process of claim 1,] *A process for producing an electrically conductive composite which comprises the steps of:*

*(a) contacting a dielectric porous substance with a liquid pyrrole,*

*(a) contacting said porous substance with a solution of a strong oxidant capable of oxidizing pyrrole to a pyrrole polymer, said strong oxidant being a cation selected from the group consisting of* $Fe^{3+}$, $Cu^{2+}$, $Ce^{4+}$, $NO^+$ *and* $(C_6H_5)_3C+$ *cations, and*

*(c) oxidizing said pyrrole by said strong oxidant in the presence of a substantially non-nucleophilic anion, and precipitating a conductive pyrrole polymer in the pores of said substance,* said non-nucleophilic anion being selected from the group consisting of p-toluenesulfonate, polystyrenesulfonate, polyvinylsulfonate, the corresponding free sulfonic acids, and dodecylsulfate.

12. The process of claim 11, said non-nucleophilic anion being derived from the free acids or the soluble salts of said acids.

[13. The process of claim 1, said oxidant and said non-nucleophilic anion being provided by a compound selected from the group consisting of ferric perchlorate, ferric chloride, cupric fluoborate and cupric perchlorate.]

14. The process of claim 1, said oxidant and said non-nucleophilic anion being provided by a compound selected from the group consisting of triphenylmethyl fluoborate and nitrosyl hexafluorophosphate.

15. The process of claim 1, said pyrrole being present in aqueous or organic solvent medium in which said pyrrole and said oxidant are soluble and which does not interfere with the oxidation reaction.

16. The process of claim 1, including an organic solvent for said oxidant, said solvent being inert with respect to said oxidant and permitting said oxidant to oxidize said pyrrole.

17. The process of claim 1, said oxidant and said non-nucleophilic anion being present in aqueous solution.

18. The process of claim 1, said pyrrole being present in a concentration in the range from about 0.03 to about 2 molar, said oxidant being present in the range of about 0.001 to about 2 molar, and said non-nucleophilic anion being present in a concentration in the range from about 0.001 to about 2 molar.

19. The process of claim 1, said dielectric porous substance selected from the group consisting of a porous ceramic, porous glass, a porous organic foam, and a fabric.

20. The process of claim 19, said porous substance being a fabric selected from the group consisting of fiberglass fabric, mixed oxide fabric and a synthetic organic fabric.

21. The process of claim 20, said porous substance being fiberglass fabric.

22. A process for producing an electrically conductive composite which comprises contacting [the] *a* dielectric porous substance with a liquid pyrrole, contacting the resulting substance containing liquid pyrrole in the pores thereof with a solution of a strong oxidant capable of oxidizing pyrrole to a pyrrole polymer and a substantially non-nucleophilic anion, *said strong oxidant being a cation selected from the group consisting of* $Fe^{3+}$, $Cu^{2+}$, $Ce^{4+}$, $NO^{+}$ *and* $(C_6H_5)_3C^{+}$ *cations,* and oxidizing said pyrrole by said strong oxidant and precipitating a conductive pyrrole polymer comprising a pyrrole polymer cation and a substantially non-nucleophilic anion in the pores of said substance, *said non-nucleophilic anion being selected from the group consisting of p-toluenesulfonate, polystyrenesulfonate, polyvinylsulfonate, the corresponding free sulfonic acids, and dodecylsulfate.*

[23. A process for producing an electrically conductive composite which comprises contacting the dielectric porous substance with a solution of a strong oxidant capable of oxidizing pyrrole to a pyrrole polymer, and a substantially non-nucleophilic anion, contacting the resulting substance containing said solution of strong oxidant and substantially non-nucleophilic anion in the pores thereof, with a liquid pyrrole, and oxidizing said pyrrole by said strong oxidant and precipitating a conductive pyrrole polymer in the pores of said substance, and pyrrole polymer comprising a pyrrole polymer cation and a substantially non-nucleophilic anion.]

[24. The process of claim 22, said pyrrole monomer selected from the group consisting of pyrrole, a 3- and 3,4-alkyl and aryl C-substituted pyrrole, an N-alkylpyrrole and an N-arylpyrrole, said strong oxidant being a cation selected from the group consisting of $Fe^{3+}$, $Cu^{2+}$, $Ce^{4+}$, $NO^{+}$ and $(C_6H_5)_3C^{+}$ cations, and said non-nucleophilic anion being selected from the group consisting of sulfate, bisulfate, perchlorate, chloride, fluoborate, $PF_6^-$, $AsF_6^-$, and $SbF_6^-$ anions.]

[25. The process of claim 24, said oxidant and said non-nucleophilic anion being provided by a compound selected from the group consisting of ferric perchlorate, ferric chloride, cupric fluoborate and cupric perchlorate.]

26. The process of claim [24,] *22*, employing pyrrole, said pyrrole being present in a concentration in the range from about 0.03 to about 2 molar, said oxidant being present in the range of about 0.001 to about 2 molar, and said non-nucleophilic anion being present in a concentration in the range from about 0.001 to about 2 molar.

27. The process of claim 26, said porous substance being a fabric selected from the group consisting of fiberglass fabric, mixed oxide fabric and a synthetic organic fabric.

[28. The process of claim 23, said pyrrole monomer selected from the group consisting of pyrrole, a 3- and 3,4-alkyl and aryl C-substituted pyrrole, an N-alkypyrrole and an N-arylpyrrole, said strong oxidant being a cation selected from the group consisting of $Fe^{3+}$, $Cu^{2+}$, $Ce^{4+}$, $NO^{+}$ and $(C_6H_5)_3C^{+}$ cations, and said non-nucleophilic anion being selected from the group consisting of sulfate, bisulfate, perchlorate, chloride, fluoborate, $PF_6^-$, $AsF_6^-$, and $SbF_6^-$ anions.]

[29. The process of claim 28, said pyrrole being present in a concentration in the range from about 0.03 to about 2 molar, said oxidant being present in the range of about 0.001 to about 2 molar, and said non-nucleophilic anion being present in a concentration in the range from about 0.001 to about 2 molar.]

[30. The process of claim 29, said porous substance being a fabric selected from the group consisting of fiberglass fabric, mixed oxide fabric and a synthetic organic fabric.]

31. An electrically conductive composite produced by the process of claim 1.

[32. An electrically conductive composite produced by the process of claim 7.]

33. An electrically conductive composite produced by the process of claim [10] *11*.

34. An electrically conductive composite produced by the process of claim 18.

35. An electrically conductive composite produced by the process of claim 20.

36. An electrically conductive composite produced by the process of claim 22.

[37. An electrically conductive composite produced by the process of claim 23.]

*38. A process for producing an electrically conductive structural composite which comprises the steps of:*

*(a) contacting a dielectric porous structural substance with a liquid pyrrole,*

*(b) contacting said porous substance with a solution of a strong oxidant capable of oxidizing pyrrole to a pyrrole polymer, said strong oxidant being a cation selected from the group consisting of* $Fe^{3+}$, $Cu^{2+}$, $Ce^{4+}$, $NO^{+}$ *and* $(C_6H_5)_3C^{+}$ *cations, and*

*(c) oxidizing said pyrrole by said strong oxidant in the presence of a substantially non-nucleophilic anion, and precipitating a conductive pyrrole polymer in the pores of said substance, said non-nucleophilic anion being selected from the group consisting of p-toluenesulfonate, polystyrenesulfonate, polyvinylsulfonate, the corresponding free sulfonic acids, and dodecylsulfate.*

*39. The process of claim 38, said pyrrole being present in aqueous medium in which said pyrrole and said oxidant are soluble and which does not interfere with the oxidation reaction.*

*40. The process of claim 38, said dielectric porous substance selected from the group consisting of a porous glass, a porous organic foam, and a fabric.*

*41. The process of claim 38, said porous substance being a fabric selected from the group consisting of fiberglass fabric, mixed oxide fabric and a synthetic organic fabric.*

*42. The process of claim 38, said porous substance being fiberglass fabric.*

*43. The process of claim 38, said oxidant and said non-nucleophilic anion being present in aqueous solution.*

*44. An electrically conductive composite produced by the process of claim 38.*

*45. An electrically conductive composite produced by the process of claim 44.*

* * * * *